(12) United States Patent
Chen et al.

(10) Patent No.: US 11,266,237 B2
(45) Date of Patent: Mar. 8, 2022

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chi-Chih Chou, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/936,784

(22) Filed: Jul. 23, 2020

(65) Prior Publication Data
US 2021/0298473 A1 Sep. 30, 2021

(30) Foreign Application Priority Data
Mar. 25, 2020 (TW) .................................. 109110390

(51) Int. Cl.
*A47B 88/477* (2017.01)
(52) U.S. Cl.
CPC .... *A47B 88/477* (2017.01); *A47B 2210/0018* (2013.01)
(58) Field of Classification Search
CPC ... A47B 88/423; A47B 88/473; A47B 88/477; A47B 2210/0016; A47B 2210/0018
See application file for complete search history.

(56) References Cited

U.S. PATENT DOCUMENTS

| | | | | |
|---|---|---|---|---|
| 3,650,578 | A  * | 3/1972 | Del Vecchio | A47B 88/57 384/18 |
| 6,883,884 | B2 | 4/2005 | Chen et al. | |
| 7,364,244 | B2* | 4/2008 | Sandoval | H05K 7/1421 312/333 |
| 2002/0084735 | A1* | 7/2002 | Liang | A47B 88/493 312/334.46 |
| 2004/0056572 | A1 | 3/2004 | Chen et al. | |
| 2008/0122333 | A1* | 5/2008 | Tseng | A47B 88/473 312/333 |
| 2009/0294393 | A1* | 12/2009 | Chen | H05K 7/1489 211/175 |
| 2011/0169389 | A1 | 7/2011 | Jeffries et al. | |
| 2012/0076446 | A1* | 3/2012 | Chen | A47B 88/43 384/21 |
| 2014/0265792 | A1* | 9/2014 | Chiu | A47B 88/423 312/334.44 |

* cited by examiner

*Primary Examiner* — Matthew W Ing
(74) *Attorney, Agent, or Firm* — Karin L. Williams; Alan D. Kamrath; Mayer & Williams PC (57) ABSTRACT

A slide rail assembly includes a first rail, a second rail, a contact structure and a locking device. The second rail is movable relative to the first rail. The contact structure is arranged on the second rail. The locking device is arranged on the first rail and includes a working member configured to be in a blocking state or an unblocking state relative to the first rail. When the second rail is located at a retracted position and when the working member is in the blocking state, the working member is configured to block the contact structure, in order to prevent the second rail from being moved relative to the first rail from the retracted position along an opening direction.

12 Claims, 13 Drawing Sheets

SLIDE RAIL ASSEMBLY

BACKGROUND OF THE INVENTION

1. Field of the Invention

The present invention relates to a slide rail, and more particularly, to a slide rail assembly with a locking device.

2. Description of the Prior Art

U.S. Pat. No. 6,883,884 B2 of Chen et al. discloses a latch assembly for a track device. The track device includes a first track member and a second track member. The first track member is configured to be located at a retracted position and an extended position relative to the second track member. The second track member is arranged with a latch seat, and the first track member is arranged with a latch assembly. When the first track member is located at the retracted position relative to the second track member, the first track member is locked to the latch seat of the second track member through the latch assembly, such that the first track member is fixed at the retracted position. When the latch assembly is unlocked and detached from the latch seat, the first track member can be moved from the retracted position to the extended position along an opening direction.

In this case, the latch assembly is arranged at a front end of the first track member, and the latch seat is arranged at a front end of the second track member. That is, when the second track member is fixed to a cabinet (or a rack) and when the first track member carries a carried object (such as a drawer or an electronic device) and is located at the retracted position relative to the second track member, anyone can operate the latch assembly in front of the track device or the cabinet (or the carried object) to unlock and detach the latch assembly from the latch seat. On the other hand, such arrangement must be provided with a special cross-section of the track member to allow the track member to have a latch function after being retracted.

However, for different market requirements, sometimes it is required to arrange the latch assembly and the latch seat at positions other than the front end of the track device. Therefore, it is important to develop various slide rail products for multiple market selections.

SUMMARY OF THE INVENTION

The present invention relates to a slide rail assembly with a locking device.

According to an embodiment of the presenting invention, a slide rail assembly comprises a first rail, a second rail, a contact structure and a locking device. The first rail has a front part and a rear part. The second rail is movable relative to the first rail, and has a front part and a rear part. The contact structure is arranged adjacent to one of the rear part of the first rail and the rear part of the second rail. The locking device is arranged adjacent to the other one of the rear part of the first rail and the rear part of the second rail. The locking device comprises a working member configured to be in one of a blocking state and an unblocking state. When the second rail is located at a retracted position relative to the first rail and when the working member is in the blocking state, the working member is configured to block the contact structure, in order to prevent the second rail from being moved relative to the first rail from the retracted position along an opening direction. When the working member is in the unblocking state, the contact structure is not blocked by the working member, in order to allow the second rail to be moved relative to the first rail from the retracted position along the opening direction.

Preferably, the contact structure is arranged adjacent to the rear part of the second rail, and the locking device is arranged adjacent to the rear part of the first rail.

Preferably, the locking device further comprises an operating member movable relative to the working member. When the operating member is moved from a first position to a second position, the operating member is configured to drive the working member to switch from the blocking state to the unblocking state.

Preferably, the locking device further comprises an elastic feature configured to provide an elastic force to the working member.

Preferably, the operating member comprises a driving part. When the operating member is moved from the first position to the second position, the operating member is configured to drive the working member to switch from the blocking state to the unblocking state through the driving part, and the driving part is configured to support the working member to be held in the unblocking state.

Preferably, the locking device further comprises a base, and the base has a predetermined feature. The operating member is movably mounted to the base, and the operating member is arranged with an elastic arm. When the operating member is moved from the first position to the second position, the operating member is configured to be engaged with the predetermined feature through at least one engaging part of the elastic arm, in order to hold the operating member at the second position.

Preferably, the locking device further comprises an elastic member arranged between the base and the operating member, and the second rail further comprises a disengaging structure. During a process of the second rail being moved relative to the first rail from the retracted position along the opening direction, the second rail is configured to drive the elastic arm through the disengaging structure to disengage the at least one engaging part of the elastic arm from the predetermined feature of the base, such that the operating member is moved from the second position to the first position in response to an elastic force of the elastic member, and the driving part of the operating member no longer supports the working member to allow the working member to be held in the blocking state in response to the elastic force of the elastic feature.

Preferably, the contact structure comprises a guiding feature. During a process of the second rail being moved relative to the first rail from an extended position to the retracted position along a retracting direction, the second rail is configured to cross the working member through the guiding feature to return to the retracted position.

Preferably, the base is arranged with at least one lug, and the working member is pivotally connected to the at least one lug through a shaft member.

Preferably, the locking device is arranged on a bracket device adjacent to the rear part of the first rail. The bracket device comprises a longitudinal wall and at least one mounting member adjacent to the longitudinal wall. The base is connected to the longitudinal wall. One of the operating member and the base is arranged with at least one longitudinal guiding part. The operating member is longitudinally movable relative to the base from the first position to the second position through the at least one longitudinal guiding part.

According to another embodiment of the present invention, a slide rail assembly comprises a first rail, a second rail, a contact structure and a locking device. The second rail is movable relative to the first rail. The contact structure is arranged on the second rail. The locking device is arranged on the first rail. The locking device comprises a working member movable relative to the first rail to be in one of a blocking state and an unblocking state, when the second rail is located at a retracted position relative to the first rail and when the working member is in the blocking state, the working member is configured to block the contact structure, in order to prevent the second rail from being moved relative to the first rail from the retracted position along an opening direction. When the working member is in the unblocking state, the contact structure is not blocked by the working member, in order to allow the second rail to be moved relative to the first rail from the retracted position along the opening direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
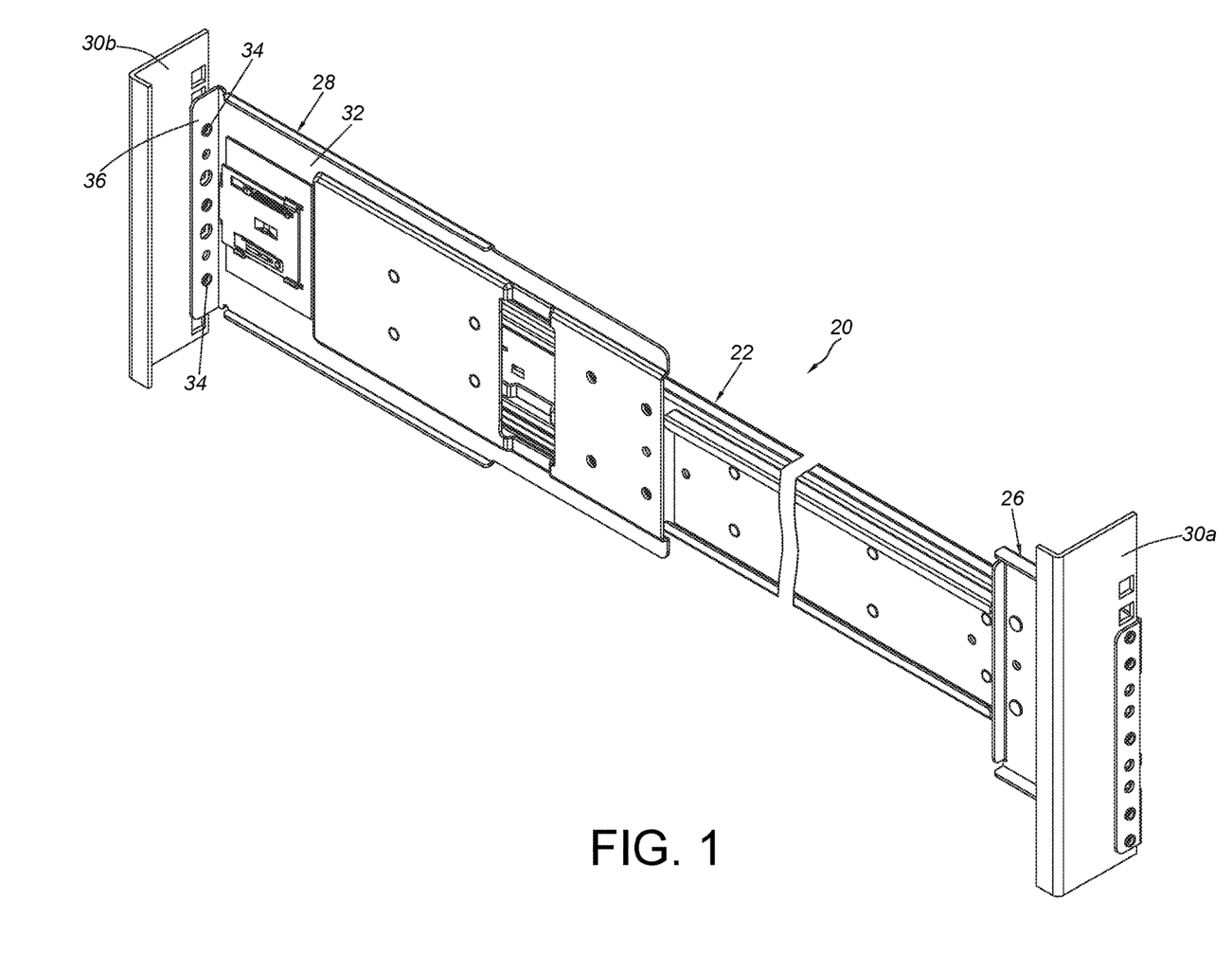
FIG. 1 is a diagram showing a slide rail assembly being mounted to a rack from a viewing angle according to an embodiment of the present invention.
Figure 2:
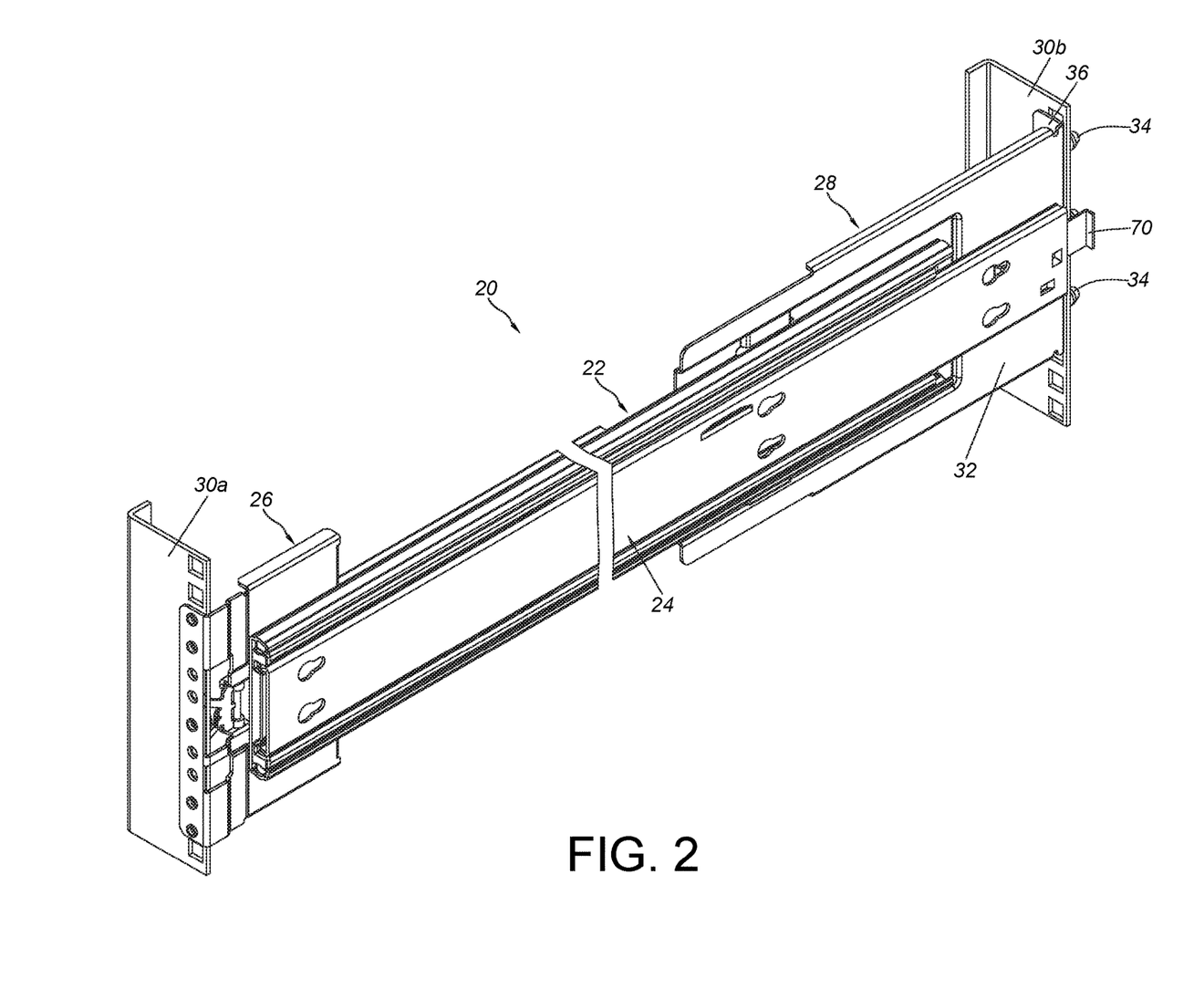
FIG. 2 is a diagram showing the slide rail assembly being mounted to the rack from another viewing angle according to an embodiment of the present invention.

As shown in FIG. 1 and FIG. 2, a slide rail assembly 20 comprises a first rail 22 and a second rail 24 movable relative to the first rail 22 according to an embodiment of the present invention. The first rail 22 is configured to be mounted to a front post 30a and a rear post 30b of a rack through a front bracket 26 and a rear bracket device 28 (hereinafter referred to as bracket device 28). Configuration of mounting the front bracket 26 to the rack is substantially identical to configuration of mounting the bracket device 28 to the rack. For example, the bracket device 28 comprises a longitudinal wall 32 and at least one mounting member 34 adjacent to the longitudinal wall 32. Preferably, the bracket device 28 further comprises an end wall 36 substantially perpendicularly bent relative to the longitudinal wall 32. The at least one mounting member 34 is arranged on the end wall 36, and configured to be mounted to at least one hole of the rear post 30b.

Figure 3:
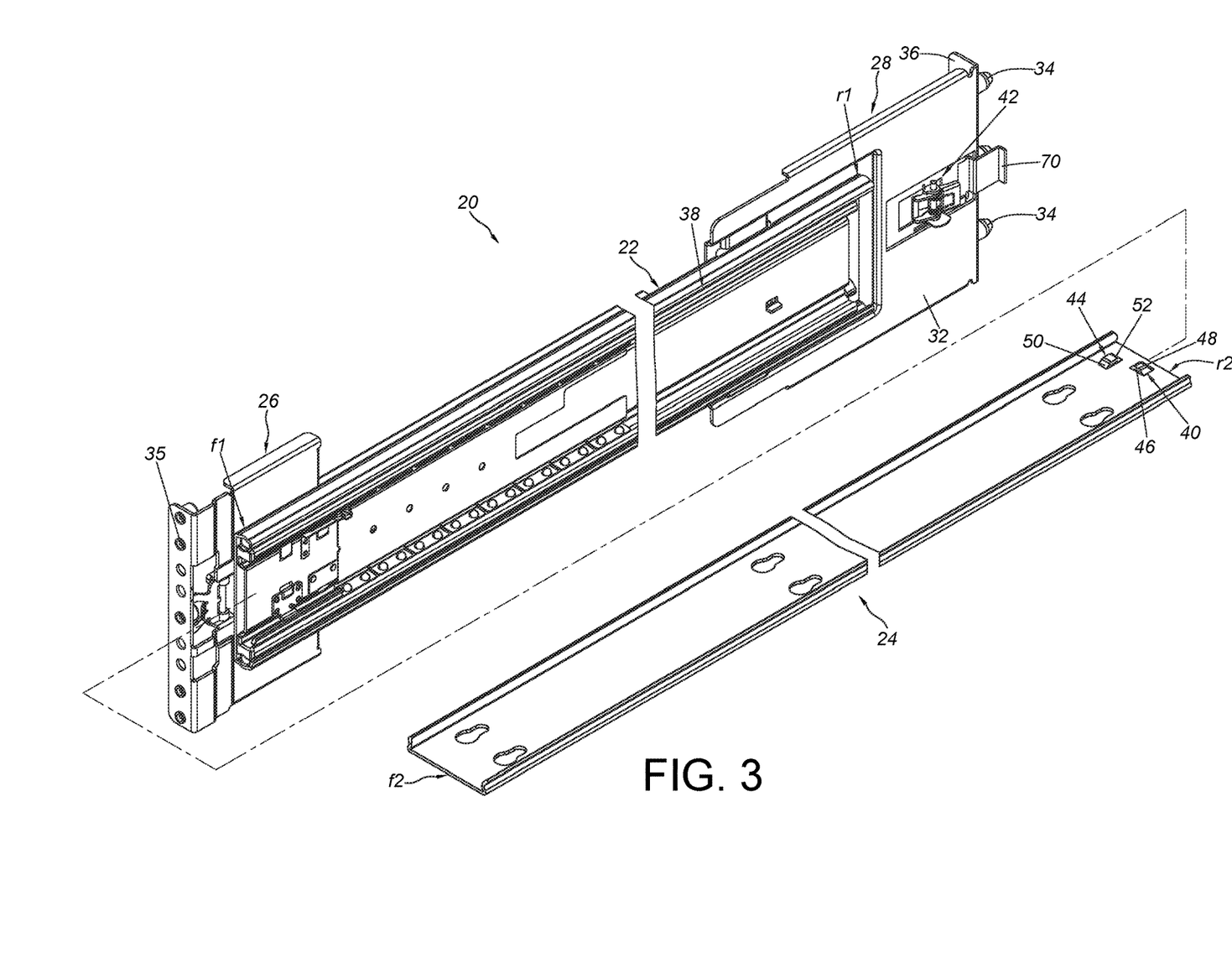
FIG. 3 is an exploded view of the slide rail assembly according to an embodiment of the present invention.

As shown in FIG. 2 and FIG. 3, the first rail 22 has a front part f1 and a rear part r1. The front bracket 26 and the bracket device 28 are respectively attached to the front part f1 and the rear part r1 of the first rail 22, such that the front bracket 26 and the bracket device 28 can be considered to be integrated with the first rail 22. Moreover, the bracket device 28 is connected (such as fixedly connected) to the first rail 22 and adjacent to the rear part r1 of the first rail 22. Preferably, the slide rail assembly 20 further comprises a third rail 38 movably mounted to the first rail 22, and the second rail 24 is movably mounted to the third rail 38. The second rail 24 has a front part f2 and a rear part r2.

The slide rail assembly 20 further comprises a contact structure 40 and a locking device 42. The contact structure 40 is arranged adjacent to one of the rear part r1 of the first rail 22 and the rear part r2 of the second rail 24. In the present embodiment, the contact structure 40 is arranged on the second rail 24 and adjacent to the rear part r2 of the second rail 24. On the other hand, the locking device 42 is arranged adjacent to the other one of the rear part r1 of the first rail 22 and the rear part r2 of the second rail 24. In the present embodiment, the locking device 42 is arranged on the bracket device 28 adjacent to the rear part r1 of the first rail 22, but the present invention is not limited thereto.

Preferably, the second rail 24 further comprises a disengaging structure 44, and the disengaging structure 44 is arranged on the second rail 24 and adjacent to the rear part r2 of the second rail 24 (as shown in FIG. 3).

Preferably, the contact structure 40 and the disengaging structure 44 are protrusions, but the present invention is not limited thereto.

Preferably, the contact structure 40 comprises a blocking feature 46 and a guiding feature 48 respectively located at a front end and a rear end of the contact structure 40. The blocking feature 46 is transversely protruded relative to the second rail 24. The guiding feature 48 has an inclined surface or an arc surface. On the other hand, the disengaging structure 44 comprises a first guiding section 50 and a second guiding section 52 respectively located at a front end and a rear end of the disengaging structure 44. Each of the first guiding section 50 and the second guiding section 52 has an inclined surface or an arc surface.

Figure 4:
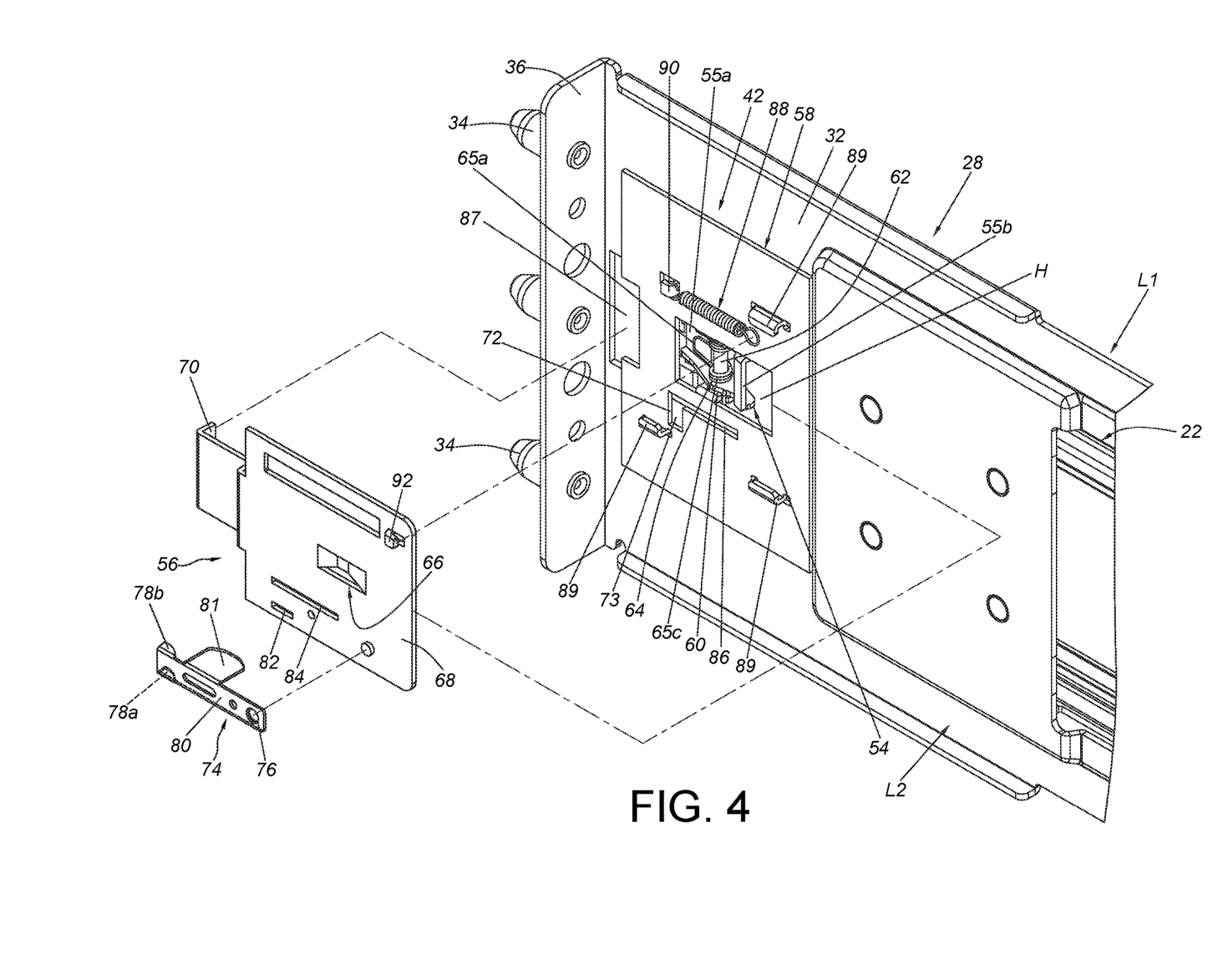
FIG. 4 is an exploded view of a locking device of the slide rail assembly according to an embodiment of the present invention.
Figure 5:
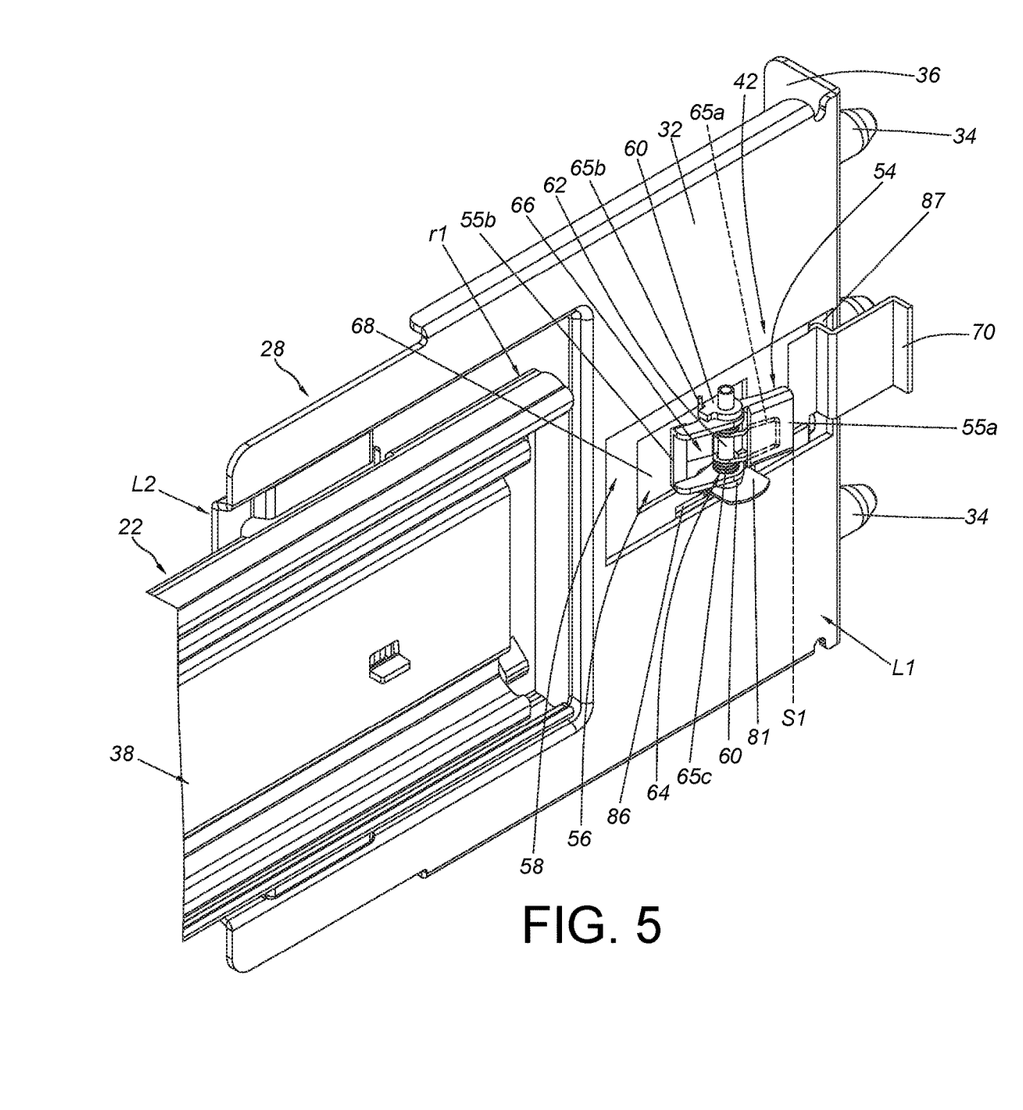
FIG. 5 is a diagram showing the locking device of the slide rail assembly according to an embodiment of the present invention.

As shown in FIG. 4 and FIG. 5, the locking device 42 is arranged on the bracket device 28 of the first rail 22. The locking device 42 comprises a working member 54. Preferably, the locking device 42 further comprises an operating member 56 and a base 58.

The longitudinal wall 32 of the bracket device 28 of the first rail 22 has a first side L1 and a second side L2 opposite to the first side L1. The first side L1 is a side adjacent to the third rail 38 (or the second rail 24 which is not shown in FIG. 4 and FIG. 5). The base 58 is connected to the second side L2.

Preferably, each of the base 58 and the longitudinal wall 32 of the bracket device 28 is formed with a corresponding space H (such as an opening shown in FIG. 4). The space H is communicated with the first side L1 and the second side L2 of the longitudinal wall 32 of the bracket device 28.

Preferably, the base 58 is arranged with at least one lug 60, such as two lugs 60. The two lugs 60 are extended from the second side L2 to the first side L1 through the space H.

Preferably, the working member 54 is movable relative to the first rail 22. In the present embodiment, the working member 54 is pivotally connected to the at least one lug 60 of the base 58 through a shaft member 62, such that the working member 54 is located at the first side L1 and corresponding to the space H. The working member 54 has a first part 55a and a second part 55b, and the shaft member 62 is located between the first part 55a and the second part 55b.

Preferably, the locking device 42 further comprises an elastic feature 64 configured to provide an elastic force to the working member 54, and the working member 54 is configured to be held in a blocking state S1 in response to the elastic force of the elastic feature 64 (as shown in FIG. 5).

Preferably, the elastic feature 64 has a first elastic section 65a, a second elastic section 65b and a mounting section 65c located between the first elastic section 65a and the second elastic section 65b. The mounting section 65c is mounted to the shaft member 62. The first elastic section 65a is configured to contact the first part 55a of the working member 54, and the second elastic section 65b is configured to contact the base 58 to be adjacent to one of the two lugs 60. In the present embodiment, the elastic feature 64 is a torsion spring, but the present invention is not limited thereto.

Preferably, the operating member 56 is movable relative to the working member 54. Moreover, the operating member 56 is movably mounted to the base 58. The operating member 56 comprises a driving part 66. The driving part 66 is extended from the second side L2 of the longitudinal wall 32 of the bracket device 28 toward the working member 54 through the space H, such that the driving part 66 is located between the first part 55a and the second part 55b of the working member 54.

Preferably, the operating member 56 comprises a base part 68 and an operating part 70 bent relative to the base part 68. The driving part 66 is arranged on the base part 68.

Preferably, the base 58 has a predetermined feature 72 (such as a wall of a through hole 73 shown in FIG. 4), and the operating member 56 is arranged with an elastic arm 74 (as shown in FIG. 4). Specifically, the elastic arm 74 comprises a connecting part 76, at least one engaging part (such as a first engaging part 78a and a second engaging part 78b), an arm part 80 arranged between the connecting part 76 and the at least one engaging part, and a first limiting feature 81 transversely extended from the arm part 80. The connecting part 76 is connected (such as fixedly connected) to the base part 68 of the operating member 56.

Preferably, the base part 68 of the operating member 56 has a first corresponding feature 82 and a second corresponding feature 84. The first engaging part 78a of the elastic arm 74 is configured to pass through the first corresponding feature 82, and the second engaging part 78b and the first limiting feature 81 of the elastic arm 74 are configured to pass through the second corresponding feature 84, such that the first engaging part 78a, the second engaging part 78b and the first limiting feature 81 of the elastic arm 74 are extended toward the base 58. The at least engaging part (such as the first engaging part 78a and the second engaging part 78b) is configured to interact with the predetermined feature 72 of the base 58, and the first limiting feature 81 is further mounted to a second limiting feature 86 (such as a bounded longitudinal guiding hole or groove) of the base 58. A longitudinal dimension of the first limiting feature 81 is smaller than a longitudinal dimension of the second limiting feature 86.

Preferably, the first corresponding feature 82 and the second corresponding feature 84 are longitudinal holes. A length of the second corresponding feature 84 is greater than a length of the first corresponding feature 82 in a longitudinal direction of the slide rail assembly 20, and the length of the second corresponding feature 84 is substantially identical to the length of the second limiting feature 86 in the longitudinal direction, but the present invention is not limited thereto.

Preferably, one of the operating member 56 and the base 58 is arranged with at least one longitudinal guiding part 89 (as shown in FIG. 4). In the present embodiment, the base 58 is arranged with a plurality of longitudinal guiding parts 89, but the present invention is not limited thereto. Moreover, the plurality of longitudinal guiding parts 89 are configured to support the operating member 56, and the operating member 56 are longitudinally movable relative to the base 58 through the plurality of longitudinal guiding parts 89.

Preferably, the operating part 70 of the operating member 56 is configured to be extended from the second side L2 to the first side L1 of the longitudinal wall 32 of the bracket device 28 through a through hole 87 of the longitudinal wall 32 of the bracket device 28 (as shown in FIG. 4).

Preferably, the locking device 42 further comprises an elastic member 88 arranged between the base 58 and the operating member 56 (as shown in FIG. 4). In the present embodiment, the base 58 is arranged with a first connecting feature 90, the operating member 56 is arranged with a second connecting feature 92, and the elastic member 88 is a spring mounted between the first connecting feature 90 and the second connecting feature 92, but the present invention is not limited thereto.

Figure 6:
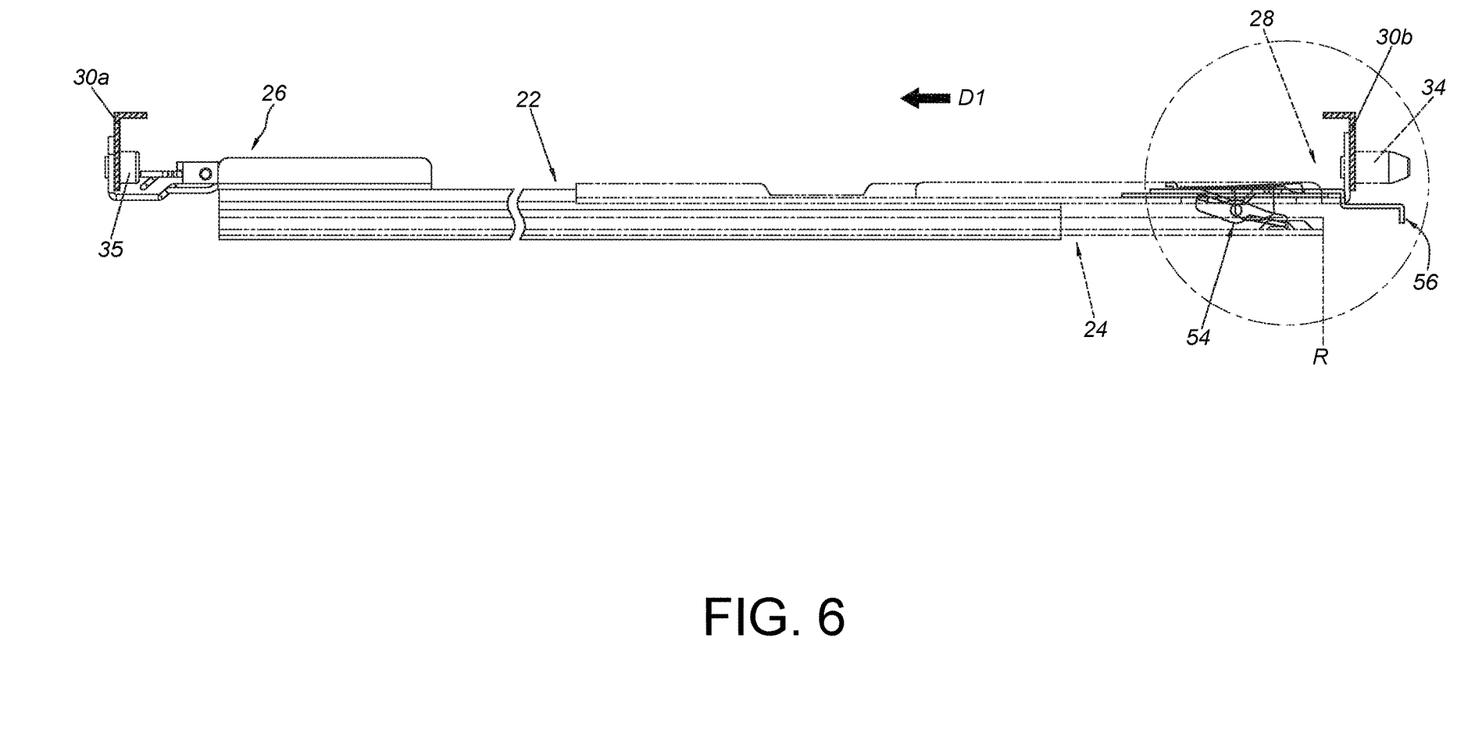
FIG. 6 is a diagram showing the slide rail assembly being in a retracted state according to an embodiment of the present invention.
Figure 7:
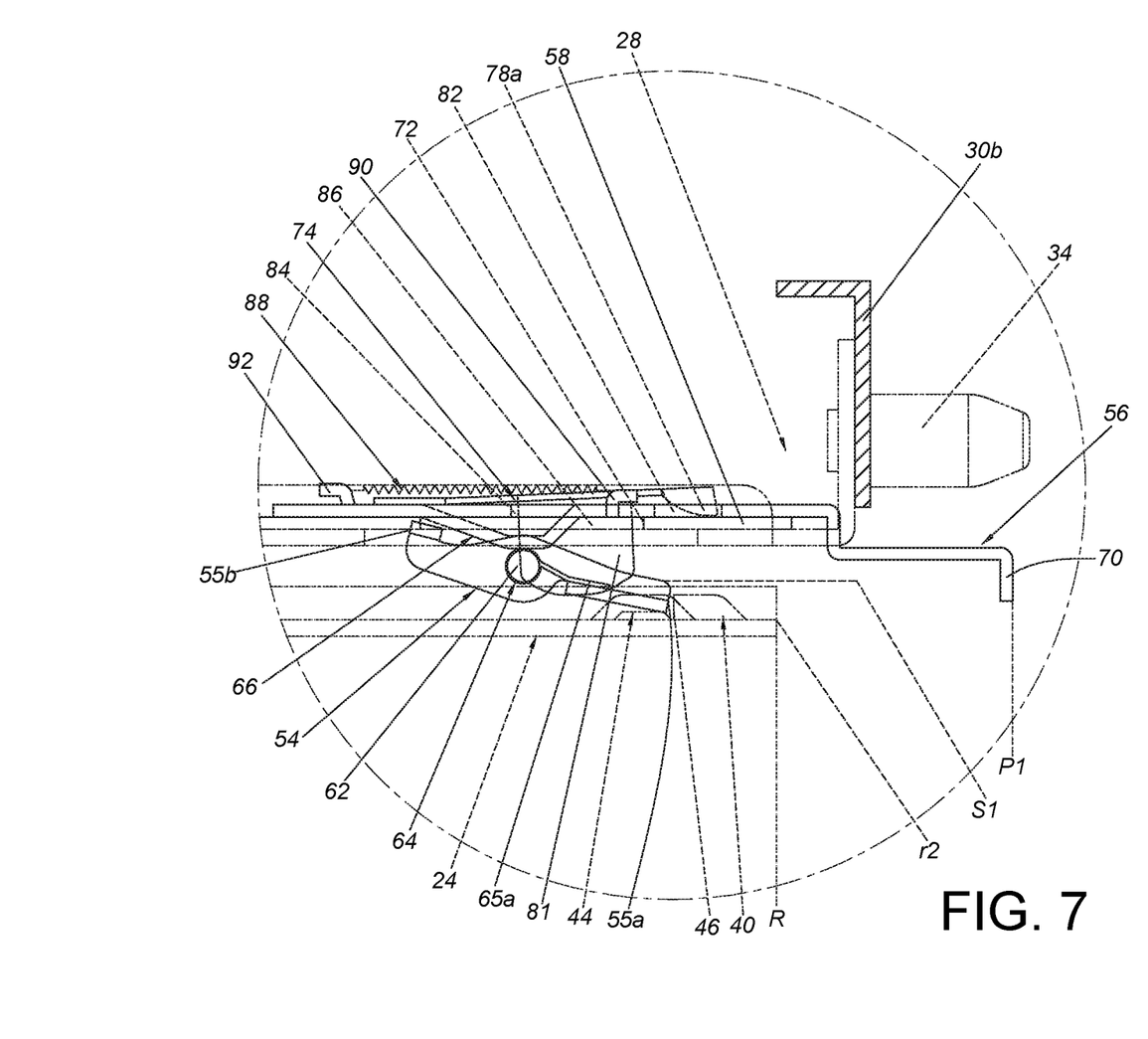
FIG. 7 is an enlarged view of an area A of FIG. 6 for showing a second rail being blocked by a working member of the locking device at a retracted position, and an operating member being located at a first position.

As shown in FIG. 6 and FIG. 7, the first rail 22 is configured to be mounted to the rear post 30b through the mounting member 34 of the bracket device 28, and mounted to the front post 30a through a mounting member 35 of the front bracket 26. The slide rail assembly 20 is in a retracted state. In such state, the second rail 24 is located at a retracted position R relative to the first rail 22.

Moreover, the working member 54 is configured to be held in the blocking state S1 in response to the elastic force of the elastic feature 64 (or the first elastic section 65a of the elastic feature 64). When the second rail 24 is located at the retracted position R relative to the first rail 22, the first part 55a of the working member 54 in the blocking state S1 is configured to block the blocking feature 46 of the contact structure 40 in order to prevent the second rail 24 from being longitudinally moved relative to the first rail 22 from the retracted position R along an opening direction D1. On the other hand, the operating member 56 is located at a first position P1 relative to the base 58. When the operating member 56 is located at the first position P1, the at least one engaging part (such as the first engaging part 78a) of the elastic arm 74 of the operating member 56 abuts against a side wall of the base 58, such that the elastic arm 74 accumulates a predetermined elastic force, and the at least one engaging part (such as the first engaging part 78a) is a predetermined longitudinal distance away formed the predetermined feature 72 of the base 58. Preferably, the driving part 66 and the second part 55b of the working member 54 in the blocking state S1 are substantially located at a same horizontal position. Preferably, each of the front end and the rear end of the driving part 66 has a guiding surface, such as an inclined surface or an arc surface.

Figure 8:
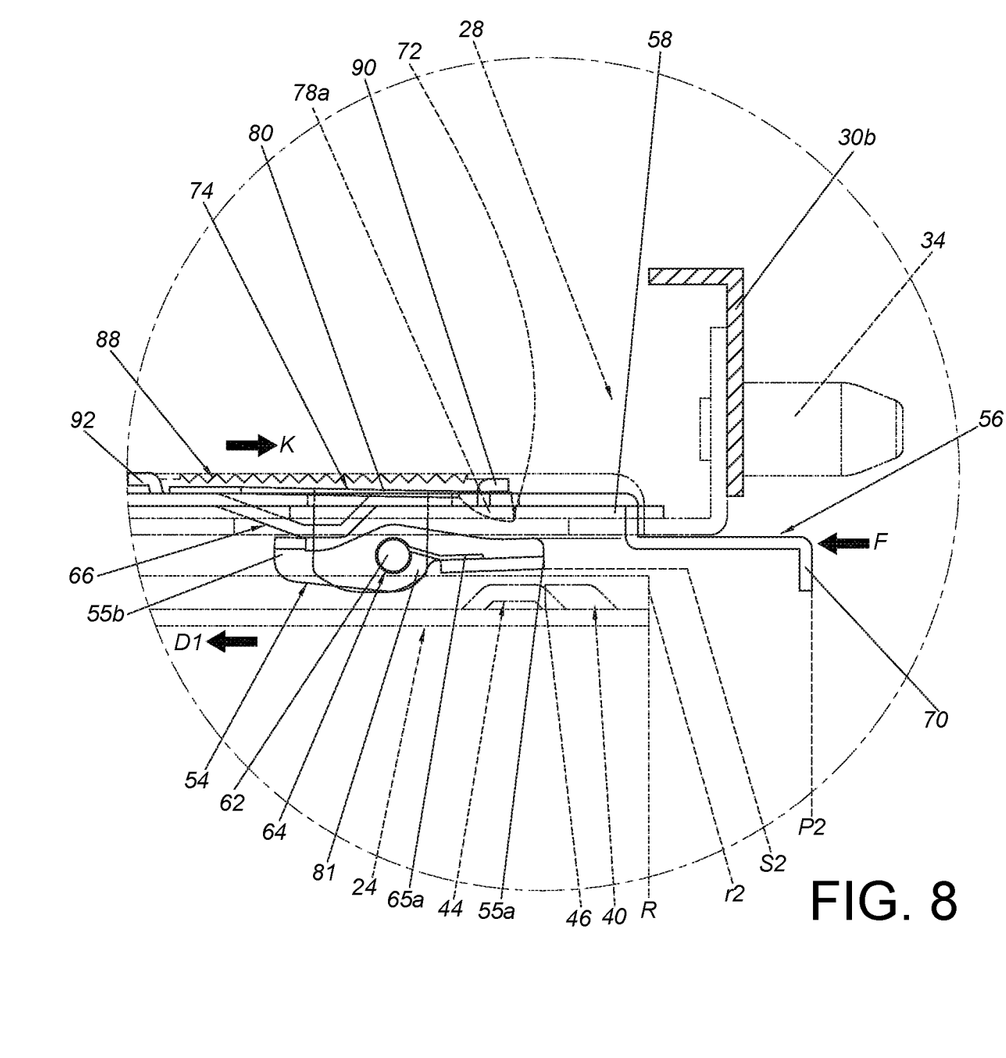
FIG. 8 is a diagram showing the operating member being moved to a second position to unblock the working member from the second rail.

As shown in FIG. 7 and FIG. 8, when the working member 54 is in an unblocking state S2, the blocking feature 46 of the contact structure 40 is not blocked by the first part 55a of the working member 54, in order to allow the second rail 24 to be moved relative to the first rail 22 from the retracted position R along the opening direction D1. For example, a user can apply a force F to the operating part 70 of the operating member 56 to longitudinally move the operating member 56 along the opening direction D1 from the first position P1 (as shown in FIG. 7) to a second position P2 (as shown in FIG. 8). In addition, the operating member 56 contacts the second part 55b of the working member 54 through the driving part 66, in order to drive the working member 54 to switch (such as rotate) from the blocking state S1 to the unblocking state S2 (as shown in FIG. 8), such that the first part 55a of the working member 54 no longer blocks the blocking feature 46 of the contact structure 40.

In addition, when the operating member 56 is located at the second position P2 relative to the base 58, the at least one engaging part (such as the first engaging part 78a) of the elastic arm 74 is configured to be engaged with the predetermined feature 72 of the base 58 in response to the predetermined force released from the elastic arm 74, such that the operating member 56 is held at the second position P2. In the meantime, the elastic member 88 accumulates a returning elastic force K along a retracting direction D2 opposite to the opening direction D1. On the other hand, the driving part 66 of the operating member 56 at the second position P2 is configured to support the second part 55b of the working member 54 (as shown in FIG. 8), such that the working member 54 is held in the unblocking state S2. In such state, the elastic feature 64 accumulates an elastic force.

Figure 9:
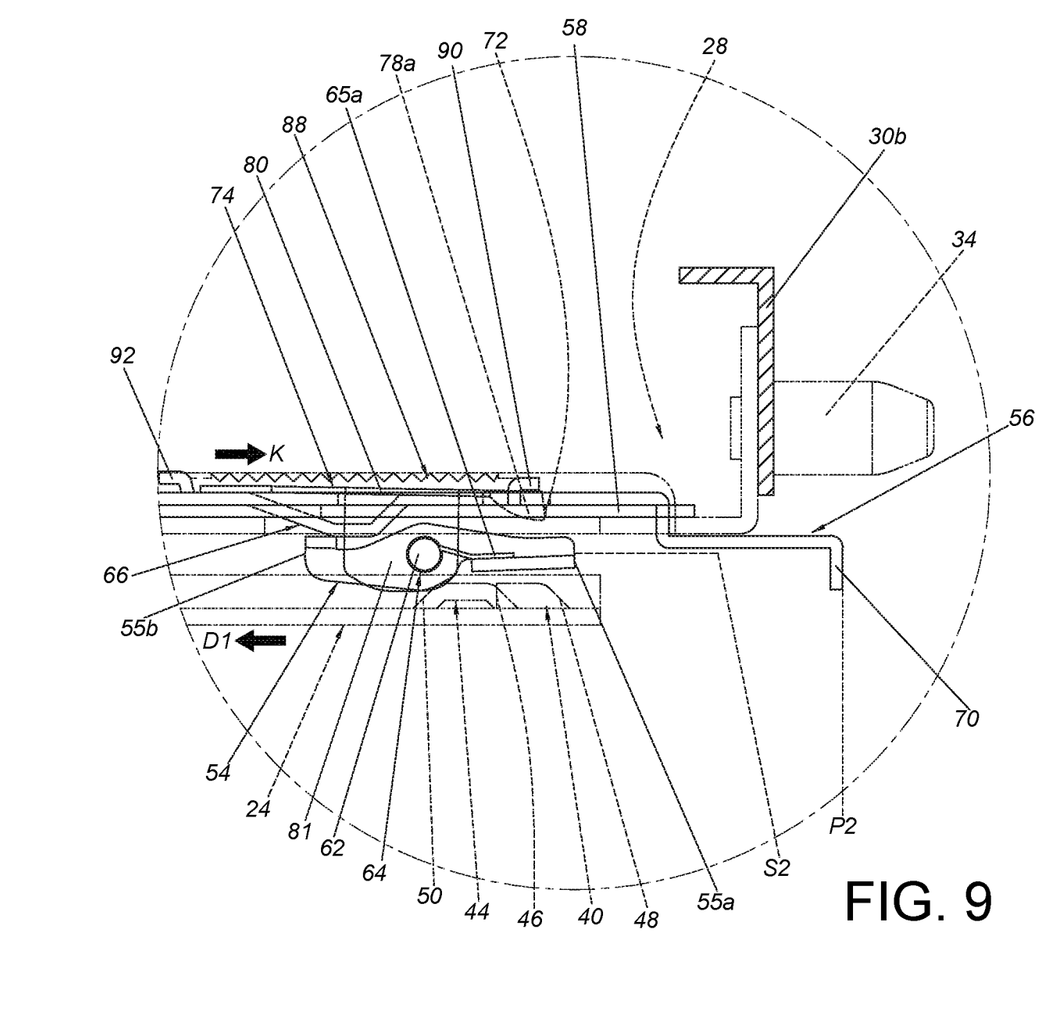
FIG. 9 is a diagram showing the second rail being moved along an opening direction.
Figure 10:
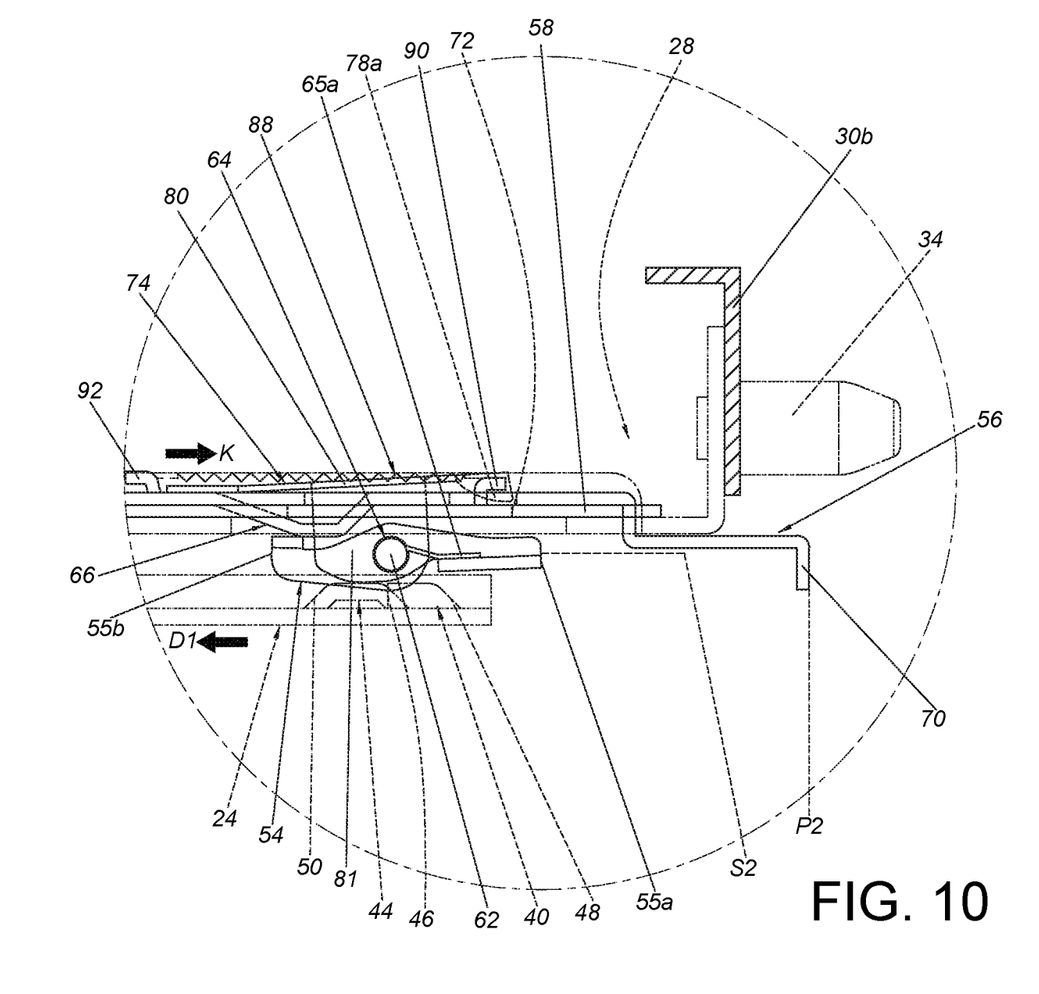
FIG. 10 is a diagram showing the second rail being further moved along the opening direction.

As shown in FIG. 8, FIG. 9 and FIG. 10, during a process of the second rail 24 being moved relative to the first rail 22 from the retracted position R along the opening direction D1, the second rail 24 contacts the first Limiting feature 81 of the elastic arm 74 through the first guiding section 50 of the disengaging structure 44 in order to drive the arm part 80 of the elastic arm 74 to disengage the at least one engaging part (such as the first engaging part 78a) of the elastic arm 74 from the predetermined feature 72 of the base 58.

Figure 11:
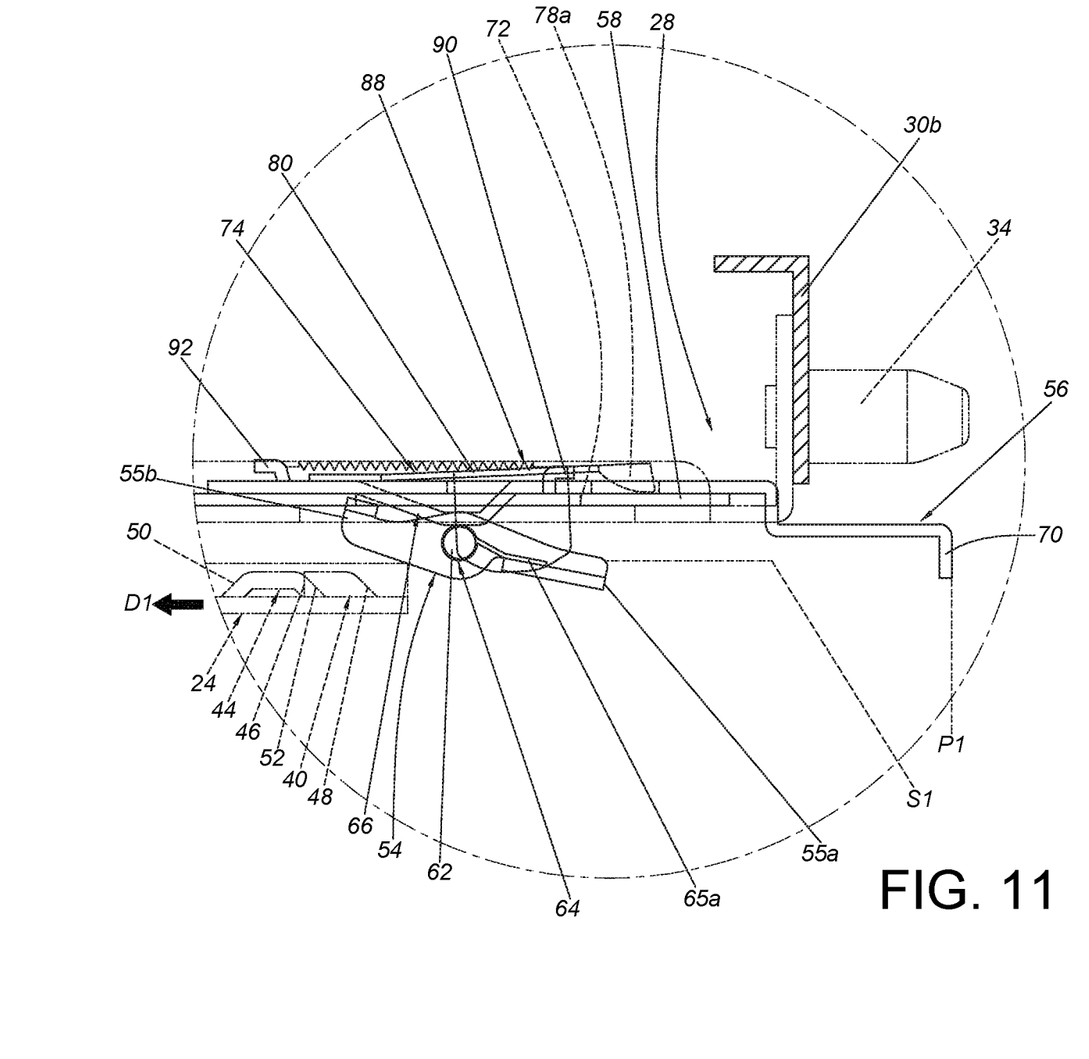
FIG. 11 is a diagram showing the second rail being further moved along the opening direction.

As shown in FIG. 10 and FIG. 11, after the at least one engaging part (such as the first engaging part 78a) of the elastic arm 74 is disengaged from the predetermined feature 72 of the base 58, the operating member 56 is moved from the second position P2 to the first position P1 in response to the elastic force (such as the return elastic force K) of the elastic member 88, and the driving part 66 of the operating member 56 no longer supports the second part 55b of the working member 54, such that the working member 54 can be held in the blocking state S1 again in response to the elastic force of the elastic feature 64. Moreover, the second rail 24 can be further moved relative to the first rail 22 along the opening direction D1 to an extended position, such that the slide rail assembly 20 is in an extended state.

Figure 12:
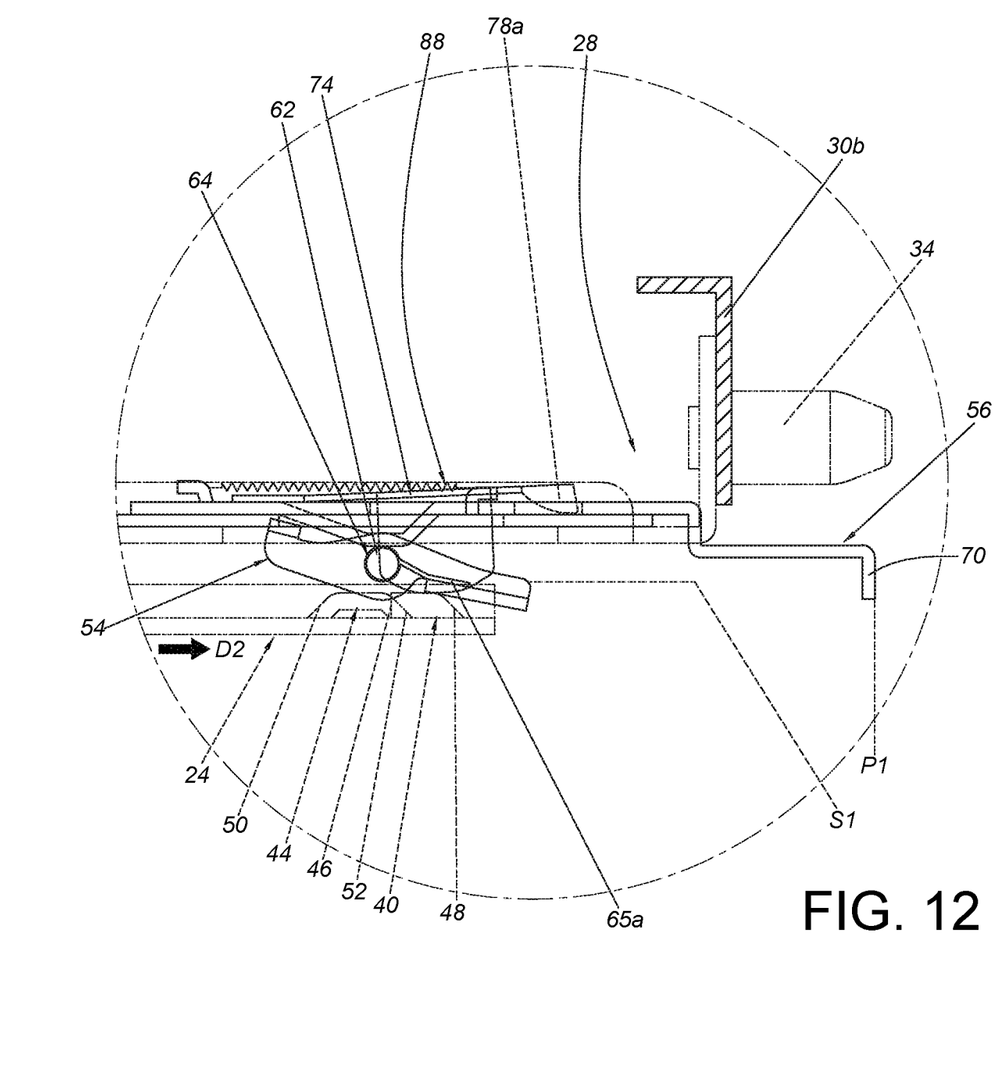
FIG. 12 is a diagram showing the second rail being moved along a retracting direction.
Figure 13:
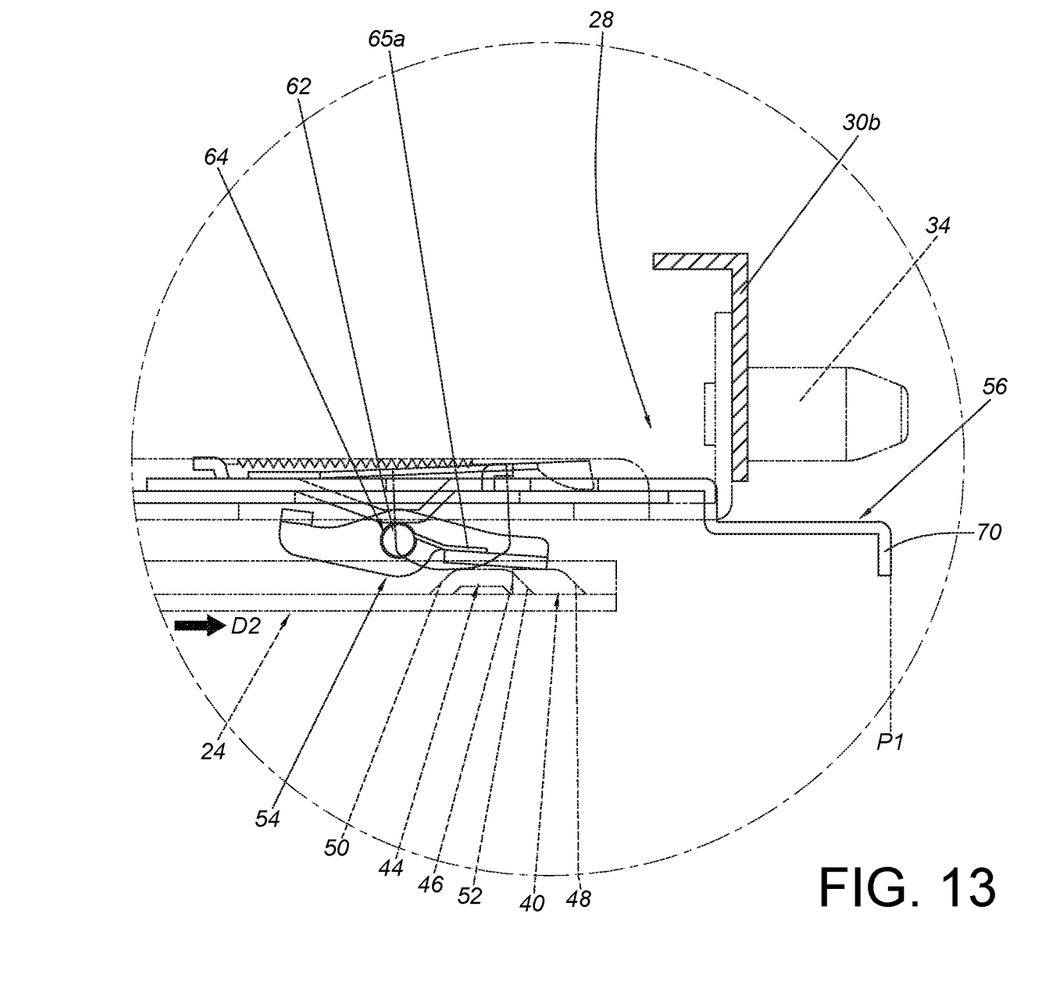
FIG. 13 is a diagram showing the second rail being further moved along the retracting direction.

As shown in FIG. 12 and FIG. 13, during a process of the second rail 24 being moved relative to the first rail 22 along the retracting direction D2 from the extended position to the retracted position R, the second rail 24 can cross the working member 54 through the guiding feature 48 to return to the retracted position R.

Specifically, during the process of the second rail 24 being moved along the retracting direction D2, the guiding feature 48 of the contact structure 40 contacts the working member 54 in the blocking state S1 (as shown in FIG. 12) to generate a working force, such that the working member 54 is rotated in response to the working force to be no longer in the blocking state S3 (as shown in FIG. 13), and the elastic feature 64 accumulates an elastic force. When the second rail 24 is located at the retracted R relative to the first rail 22 (as shown in FIG. 7) and the working member 54 returns to the blocking state S1 in response to the elastic force of the elastic feature 64, the first part 55a of the working member 54 is configured to block the blocking feature 46 of the contact structure 40 in order to prevent the second rail 24 from being longitudinally moved relative to the first rail 22 again from the retracted position R along the opening direction D1.

Therefore, the slide rail assembly 20 according to the embodiments of the present invention is characterized in that:

1. The locking device 42 and the contact structure 40 are respectively arranged adjacent to the rear parts of the two rails of the slide rail assembly 20. Therefore, in contrast to the prior art, locking mechanism of the locking device 42 locking the contact structure 40 of the second rail 24 can be prevented from being easily opened by anyone standing in front of the slide rail assembly 20. In other words, through the slide rail assembly 20 disclosed in the embodiments of the present invention, the user must move closer to a rear part of the slide rail assembly 20 to open the locking mechanism of the locking device 42 which locks the contact structure 40 of the second rail 24.

2. The operating member 56 is configured to be engaged with the predetermined feature 72 of the base 58 through the elastic arm 74 to be held at the second position P2, such that the working member 54 is supported by the operating member 56 and held in the unblocking state S2. Once the elastic arm 74 is disengaged, the operating member 56 is moved from the second position P2 to the first position P1 in response to the elastic force of the elastic member 88, and the working member 54 returns to the blocking State S1 from the unblocking state S2.

3. Each time when the second rail 24 is moved relative to the first rail 22 in the retracting direction D2 to the retracted position R, the working member 54 is configured to be in the blocking state S1 to lock the second rail 24 in the retracted position R.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
   a first rail having a front part and a rear part;
   a second rail movable relative to the first rail, the second rail having a front part and a rear part;
   a contact structure arranged adjacent to the rear part of the second rail; and
   a locking device arranged adjacent to the rear part of the first rail, the locking device comprising a working member configured to be in one of a blocking state and an unblocking state;
   wherein when the second rail is located at a retracted position relative to the first rail and when the working member is in the blocking state, the working member is configured to block the contact structure, in order to prevent the second rail from being moved relative to the first rail from the retracted position along an opening direction;

wherein when the working member is in the unblocking state, the contact structure is not blocked by the working member, in order to allow the second rail to be moved relative to the first rail from the retracted position along the opening direction;

wherein the locking device further comprises an operating member movable relative to the working member; wherein when the operating member is moved from a first position to a second position, the operating member is configured to drive the working member to switch from the blocking state to the unblocking state;

wherein the operating member comprises a driving part; wherein when the operating member is moved from the first position to the second position, the operating member is configured to drive the working member to switch from the blocking state to the unblocking state through the driving part, and the driving part is configured to support the working member to be held in the unblocking state;

wherein the locking device further comprises a base, and the base has a predetermined feature; wherein the operating member is movably mounted to the base, and the operating member is arranged with an elastic arm; wherein when the operating member is moved from the first position to the second position, the operating member is configured to be engaged with the predetermined feature through at least one engaging part of the elastic arm, in order to hold the operating member at the second position.

2. The slide rail assembly of claim 1, wherein the locking device further comprises an elastic feature configured to provide an elastic force to the working member.

3. The slide rail assembly of claim 1, wherein the locking device further comprises an elastic member arranged between the base and the operating member, and the second rail further comprises a disengaging structure; wherein during a process of the second rail being moved relative to the first rail from the retracted position along the opening direction, the second rail is configured to drive the elastic arm through the disengaging structure to disengage the at least one engaging part of the elastic arm from the predetermined feature of the base, such that the operating member is moved from the second position to the first position in response to an elastic force of the elastic member, and the driving part of the operating member no longer supports the working member to allow the working member to be held in the blocking state in response to the elastic force of the elastic feature.

4. The slide rail assembly of claim 3, wherein the contact structure comprises a guiding feature; wherein during a process of the second rail being moved relative to the first rail from an extended position to the retracted position along a retracting direction, the second rail is configured to cross the working member through the guiding feature to return to the retracted position.

5. The slide rail assembly of claim 1, wherein the base is arranged with at least one lug, and the working member is pivotally connected to the at least one lug through a shaft member.

6. The slide rail assembly of claim 3, wherein the locking device is arranged on a bracket device adjacent to the rear part of the first rail, and the bracket device comprises a longitudinal wall and at least one mounting member adjacent to the longitudinal wall; wherein the base is connected to the longitudinal wall, one of the operating member and the base is arranged with at least one longitudinal guiding part, and the operating member is longitudinally movable relative to the base from the first position to the second position through the at least one longitudinal guiding part.

7. A slide rail assembly, comprising:
a first rail;
a second rail movable relative to the first rail;
a contact structure arranged on the second rail and adjacent to a rear part of the second rail; and
a locking device arranged on the first rail and adjacent to a rear part of the first rail, the locking device comprising a working member movable relative to the first rail to be in one of a blocking state and an unblocking state;

wherein when the second rail is located at a retracted position relative to the first rail and when the working member is in the blocking state, the working member is configured to block the contact structure, in order to prevent the second rail from being moved relative to the first rail from the retracted position along an opening direction;

wherein when the working member is in the unblocking state, the contact structure is not blocked by the working member, in order to allow the second rail to be moved relative to the first rail from the retracted position along the opening direction;

wherein the locking device further comprises an operating member movable relative to the working member; wherein when the operating member is moved from a first position to a second position, the operating member is configured to drive the working member to switch from the blocking state to the unblocking state;

wherein the operating member comprises a driving part; wherein when the operating member is moved from the first position to the second position, the operating member is configured to drive the working member to switch from the blocking state to the unblocking state through the driving part, and the driving part is configured to support the working member to be held in the unblocking state;

wherein the locking device further comprises a base, and the base has a predetermined feature; wherein the operating member is movably mounted to the base, and the operating member is arranged with an elastic arm; wherein when the operating member is moved from the first position to the second position, the operating member is configured to be engaged with the predetermined feature through at least one engaging part of the elastic arm, in order to hold the operating member at the second position.

8. The slide rail assembly of claim 7, wherein the locking device further comprises an elastic feature configured to provide an elastic force to the working member.

9. The slide rail assembly of claim 7, wherein the locking device further comprises an elastic member arranged between the base and the operating member, and the second rail further comprises a disengaging structure; wherein during a process of the second rail being moved relative to the first rail from the retracted position along the opening direction, the second rail is configured to drive the elastic arm through the disengaging structure to disengage the at least one engaging part of the elastic arm from the predetermined feature of the base, such that the operating member is moved from the second position to the first position in response to an elastic force of the elastic member, and the driving part of the operating member no longer supports the working member to allow the working member to be held in the blocking state in response to the elastic force of the elastic feature.

10. The slide rail assembly of claim 9, wherein the contact structure comprises a guiding feature; wherein during a process of the second rail being moved relative to the first rail from an extended position to the retracted position along a retracting direction, the second rail is configured to cross the working member through the guiding feature to return to the retracted position.

11. The slide rail assembly of claim 7, wherein the base is arranged with at least one lug, and the working member is pivotally connected to the at least one lug through a shaft member.

12. The slide rail assembly of claim 7, wherein the locking device is arranged on a bracket device adjacent to the rear part of the first rail, and the bracket device comprises a longitudinal wall and at least one mounting member adjacent to the longitudinal wall; wherein the base is connected to the longitudinal wall, one of the operating member and the base is arranged with at least one longitudinal guiding part, and the operating member is longitudinally movable relative to the base from the first position to the second position through the at least one longitudinal guiding part.

* * * * *